United States Patent [19]

Liu et al.

[11] Patent Number: 5,072,873
[45] Date of Patent: Dec. 17, 1991

[54] DEVICE FOR SOLDER REMOVAL

[75] Inventors: Jay J. Liu, Chandler; Thomas A. Scharr, Mesa; William H. Lytle, Chandler, all of Ariz.

[73] Assignee: Motorola, Inc., Schaumburg, Ill.

[21] Appl. No.: 518,615

[22] Filed: May 3, 1990

[51] Int. Cl.$^5$ ............................................. B23K 1/018
[52] U.S. Cl. ........................................ 228/264; 228/19
[58] Field of Search ................... 228/19, 20, 54, 185, 228/180.2, 264; 428/601, 573

[56] References Cited

U.S. PATENT DOCUMENTS

| 3,387,191 | 6/1968 | Fishman et al. ............... 357/68 |
| 4,067,104 | 1/1978 | Tracy ............................. 228/185 |
| 4,090,656 | 5/1978 | Sato et al. ................... 228/54 X |
| 4,465,223 | 8/1984 | Cammarano et al. ......... 228/123 |

Primary Examiner—Kenneth J. Ramsey
Attorney, Agent, or Firm—Miriam Jackson; Joe E. Barbee

[57] ABSTRACT

A device having a plurality of columnar structures comprised of a solderable metal disposed on a supporting base is used to remove solder from a substrate surface. Capillary action takes place in the area between the columns, thus removing the solder from the substrate surface. The present invention may be fabricated by forming columnar structures on the supporting base through mask openings or by etching a solderable metal layer into columnar structures. A standoff may be built into the device to prevent solder residue from remaining on the substrate surface between solder pads and to allow a controllable amount of solder to be left on the substrate surface.

18 Claims, 2 Drawing Sheets

DEVICE FOR SOLDER REMOVAL

BACKGROUND OF THE INVENTION

This invention relates, in general, to a device for removing molten solder from a surface, and more particularly, to a device for solder removal in semiconductor processing.

It is often necessary to remove solder from the surface of a substrate to which a defective integrated circuit chip is bonded and then removed. In flip-chip processing, a chip is directly bonded to solder pads on a substrate; if the chip is defective, it must be removed from the substrate, leaving behind nonuniform solder bumps. This solder must be removed before bonding a new chip with new solder, because the nonuniform solder bumps left after removal of the defective chip may cause shorts or opens.

The removal of solder from the substrate has been achieved by vacuum suction. Vacuum suction comprises the suction of solder by an apparatus that utilizes a heated nitrogen gas. This vacuum suction apparatus is undesirable because it is very complicated to make and use. The velocity and the temperature of the nitrogen must be optimized in order to melt and remove the solder. In addition, solder residue may be left at the substrate surface between solder pads, causing leakage or other undesirable electrical characteristics. Furthermore, a different size vacuum suction device must be made for each size chip, which can get very expensive.

Another method of removing solder from a substrate comprises using a copper powder cake. A copper powder cake is a sponge-like material formed by sintering copper powder or balls. The copper powder cake works like a sponge to remove solder from a substrate. The use of a copper powder cake is undesirable because the process of making the cake is complicated as well as expensive. Because the copper powder cake may not be reuseable, it would be desirable to provide a new and less expensive device for solder removal. The copper powder cake may also leave solder residue on the surface of the substrate between solder pads. Both of the above devices also do not leave controllable amounts of solder to provide a uniform surface for the new solder. Because both of the devices are undesirable to make and use, it should be appreciated that it would be desirable to provide an improved device for solder removal.

Accordingly, it is an object of the present invention to provide a new, improved device for solder removal.

Another object of the present invention is to provide a device for solder removal which does not leave solder residue between solder pads.

A further object of the present invention is to provide a device for solder removal which allows for a controllable amount of solder to be left on the solder pads.

An additional object of the present invention is to provide a device and method for making a device for solder removal.

Yet another object of the present invention is to provide an improved device for solder removal without utilizing vacuum suction.

Yet a further object of the present invention is to provide a device for solder removal which can be easily fabricated for different sizes of chips.

Still another object of the present invention is to provide a device for solder removal which removes more solder than the prior art.

Still a further object of the present invention is to provide a device for solder removal which is easy to manufacture and use.

SUMMARY OF THE INVENTION

In accordance with the present invention, the above and other objects and advantages are achieved by providing an improved device for solder removal. The device is comprised of a plurality of metallic columns disposed on a supporting base. The surface of the columns are metallized to be solderable with molten solder. Capillary action takes place in the area between the columns, thus removing the solder from a substrate surface. During the solder removal process, the device, which may be heated close to the melting point of the solder, is brought down to touch the solder bumps on a substrate, which may also be heated. A standoff may be built into the device to further prevent solder residue from remaining on the substrate surface between solder pads and to allow a controllable amount of solder to be left on the substrate surface.

DETAILED DESCRIPTION OF THE DRAWINGS

Figure 1:
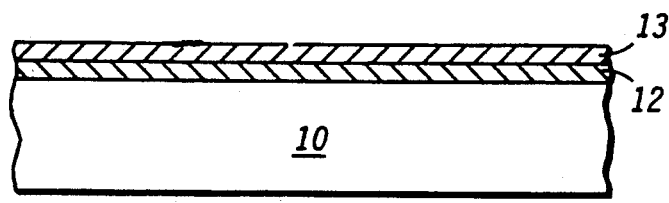
FIGS. 1-3 illustrate enlarged, cross-sectional views of a first embodiment of the present invention at various stages of a first fabrication process.
Figure 2:
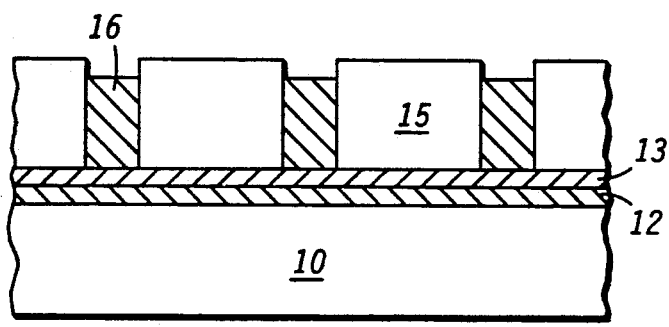
Figure 3:
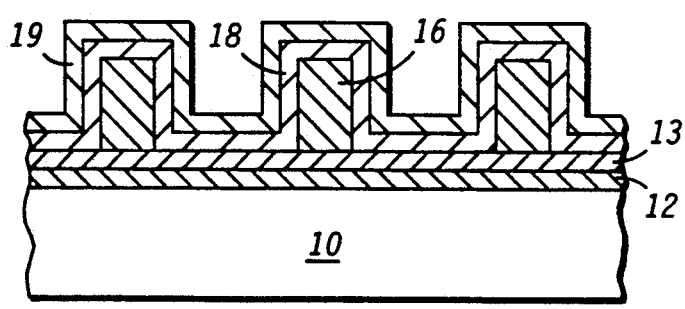

FIGS. 1-3 illustrate enlarged, cross-sectional views of a first embodiment of the present invention at various stages of a first fabrication process. FIG. 1 illustrates a device 9 in a beginning stage of processing. A supporting base 10 is provided, on which an adhesion metal layer 12 is formed. A plating bus 13 is subsequently formed on adhesion metal layer 12. Supporting base 10 is preferably comprised of silicon, but may be comprised of any planar, rigid material, such as a ceramic, a semiconductor material, or even a metal. In a preferred embodiment, adhesion metal layer 12 is comprised of a metal which adheres well to supporting base 10; in this embodiment preferably titanium, titanium tungsten, or chromium. Other adhesion metals may be used, depending on what supporting base 10 is comprised of. Adhesion layer 12 is formed by standard metallization processes well known in the art, and is preferably of a thickness of approximately 500 to 2000 angstroms. Plating bus 13 is preferably comprised of a conductive material, such as copper or nickel. Plating bus 13 is also formed by standard metallization processes, and is preferably of a thickness of approximately 5000 to 20,000 angstroms.

FIG. 2 illustrates the structure of FIG. 1 after further processing. First, a masking layer, a photoresist layer 15, is formed and patterned using standard photolithographic processes to form a plurality of openings on the surface of plating bus 13. Subsequently, a solderable metal layer 16 is formed in the openings of photoresist layer 15. Thus, solderable metal layer 16 forms a plurality of columnar structures or columns. The configuration of the plurality of columnar structures of solderable metal 16 may vary from that shown, depending on the shape of the openings in photoresist layer 15 and the manner in which solderable metal layer 16 is formed, however, it should be noted that the configuration is generally columnar. Solderable metal layer 16 is preferably formed by an electroplating process because the thickness of solderable metal layer 16 is preferably approximately 25 microns or greater. Solderable metal layer 16 may be comprised of copper, nickel, rhodium, palladium, or other suitable solderable metals. In a preferred embodiment, plating bus 13 and solderable metal layer 16 are comprised of the same metal so that maximum adhesion may be obtained between them. Copper is a convenient metal to use for plating bus 13 and solderable metal layer 16 because copper is prevalently used in semiconductor manufacture. Photoresist layer 15 is thereafter removed.

After photoresist layer 15 is removed, device 9 shown in FIG. 2 may be used to remove solder from a substrate surface (not shown). Either device 9, the substrate, or both are heated close to the melting point of the solder. Wick device 9 is positioned so that the plurality of columns of solderable metal layer 16 touch the solder bumps. Capillary action takes place in the area between the columns of solderable metal layer 16, thus removing the solder from the surface without the need for vacuum suction. If solderable metal layer 16 is comprised of nickel or copper, the use of a solderable flux is required, because nickel and copper oxidize in air. When oxidized, the nickel or copper metal becomes unsolderable, thus is unable to remove the solder. Flux is a material well known in the art that may be applied to a metal to remove the oxide. The use of flux is an additional step that may leave contaminants on the substrate surface, which is undesirable. The present invention allows the use of device 9 shown in FIG. 2 that requires the use of flux, or alternatively, device 9 may be further processed to enable solder removal without the use of flux. An embodiment of this structure is shown in FIG. 3.

FIG. 3 illustrates the structure of FIG. 2 further along in the process. After photoresist layer 15 is removed, a barrier metal layer 18 is formed on the surface of solderable metal layer 16 and plating bus 13. In a preferred embodiment barrier metal layer 18 is comprised of nickel or rhodium. Barrier metal layer 18 is formed by standard processing known in the art, and is preferably of a thickness of approximately 2000-10,000 angstroms. Barrier metal layer 18 prevents the diffusion of solderable metal layer 16, such as copper, through it. A non-oxidizing, solderable metal layer 19 is then formed on barrier metal layer 18. Non-oxidizing, solderable metal layer 19 is preferably comprised of gold. Non-oxidizing, solderable metal layer 19 is formed by any conventional methods, and is preferably of a thickness less than approximately 5000 angstroms. If non-oxidizing, solderable metal layer 19 is comprised of gold, then it is desirable for it not to be too thick because the solubility of gold in solder is high. If the gold is too thick, some amount of gold may remain on and may contaminate the surface of the substrate from which solder is to be removed. However, barrier metal layer 18 may not be necessary if thermal conditions are not severe and solderable metal layer 16 does not diffuse to the surface of non-oxidizing, solderable metal layer 19 and oxidize.

Figure 4:
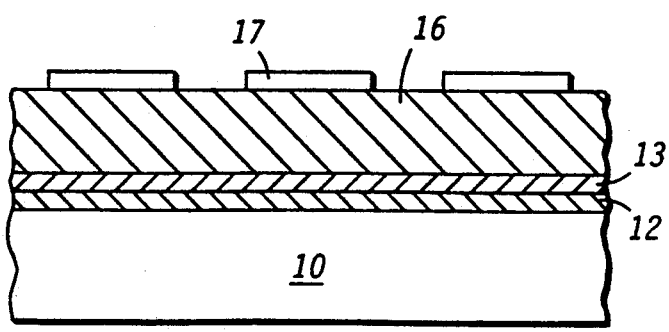
FIGS. 4-5 illustrate enlarged, cross-sectional views of a first embodiment of the present invention at various stages of a second fabrication process.

FIG. 4 illustrates a first embodiment of the present invention in a beginning stage of a second fabrication process. The same reference numerals are used to describe the same materials as shown in FIGS. 1-3. Here, adhesion metal layer 12 and plating bus 13 are formed in the same manner as described in FIG. 1. The plurality of columns formed from solderable metal layer 16, however, are formed in a different manner. Solderable metal layer 16 is formed completely on plating bus 13 using any conventional methods. Subsequently, a photoresist layer 17 is patterned and etched on the surface of solderable metal layer 16 to form a plurality of openings.

Figure 5:
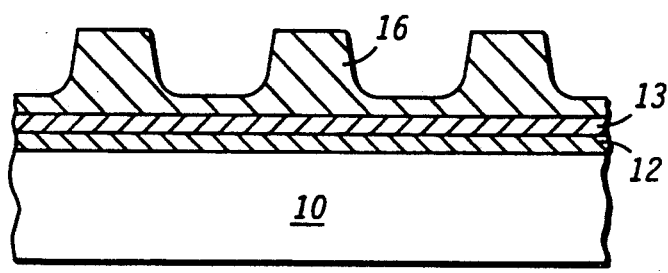

FIG. 5 illustrates the structure of FIG. 4 further along in the process. Solderable metal layer 16 is etched to form a plurality of columns, using photoresist layer 17 as a mask. Note that straight sidewalls may not be obtainable due to the undercutting of the solderable metal layer 16 underneath photoresist layer 17. Photoresist layer 17 is then removed. Further processing may be done to form barrier metal layer 18 and non-oxidizing, solderable metal layer 19 if desired as is described with reference to FIG. 3.

Figure 6:
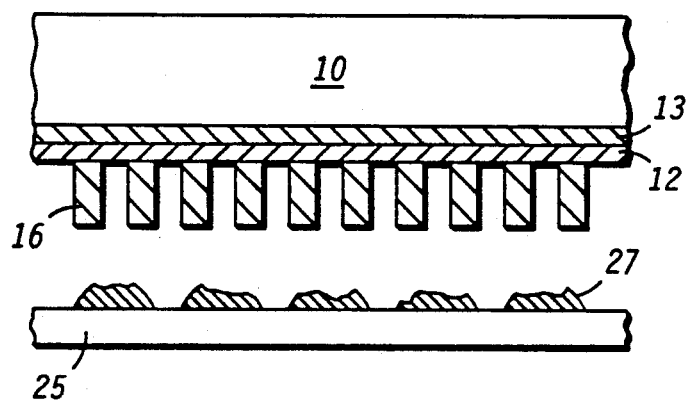
FIG. 6 illustrates an enlarged, cross-sectional view of a first embodiment of the present invention during operation.

FIG. 6 illustrates an enlarged, cross-sectional view of a first embodiment of the present invention during operation. This is the same structure as shown in FIG. 2, with photoresist layer 15 removed. A substrate 25 is also illustrated to facilitate the description of the way in which the present invention may be used. Solder bumps 27 are located on the surface of substrate 25. In a preferred embodiment, the area taken up by the columns of solderable metal layer 16 is approximately equal to the size of a chip which is to be bonded to substrate 25. The pitch, height and width of the columns of solderable metal layer 16 are designed to achieve optimum solder removal. The height of the columns of solderable metal layer 16 may be primarily dictated by processing limitations. Columns of solderable metal layer 16 as high as 25 to 30 microns have been obtained. Typically, solder bumps 27 have a diameter of approximately 100 microns. Thus, in one example, a plurality of columns of solderable metal layer 16 having heights of approximately 25 microns, widths of approximately 25 microns, and pitches of approximately 50 microns or less would be suitable for removing solder bumps 27 from the surface of substrate 25. The present invention thus provides for the uniform removal of solder 27.

Figure 7:
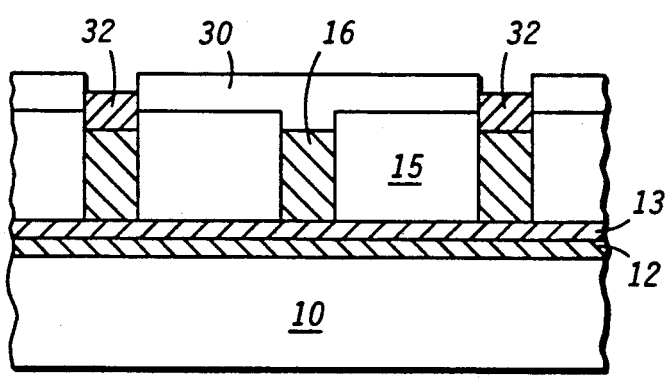
FIGS. 7-8 illustrate enlarged, cross-sectional views of a second embodiment of the present invention at various stage of fabrication.

FIG. 7 illustrates an enlarged cross-sectional view of a second embodiment of the present invention. FIG. 7 illustrates the structure of FIG. 2 with a photoresist layer 30 formed and patterned on the surface of device 9. Openings in photoresist layer 30 are provided over selected columns of solderable metal layer 16. Then, standoffs 32 are formed on the selected columns of solderable metal layer 16. In a preferred embodiment, standoffs 32 are comprised of a non-solderable metal, such as chromium, so that molten solder will not contact the substrate surface (not shown) during operation. However, standoffs 32 may also be comprised of solderable metals, such as copper or nickel.

Figure 8:
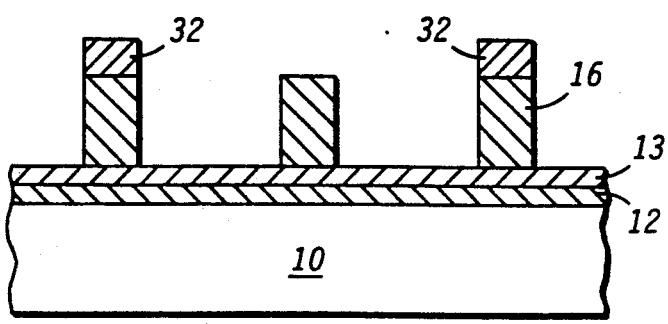

FIG. 8 illustrates the structure of FIG. 7 further along in the process. Photoresist layers 30 and 15 are removed. Further processing may take place as is described with reference to FIG. 3 to form barrier metal layer 18 and non-oxidizing, solderable metal layer 19. Alternatively, a non-solderable, non-platable material (not shown), such as a polymer, may be formed on metal layer 32. If a barrier metal layer 18 and a non-oxidizing, solderable metal layer 19 are electroplated, they will not plate on the non-solderable, non-platable metal. In this way, a non-solderable standoff may still be formed even if barrier metal layer 18 and non-oxidizing, non-solderable metal layer 19 are formed on columns of solderable metal layer 16 which do not have standoffs 32 formed on them.

Standoffs 32 can be formed by several means. FIG. 8 illustrates only one such means, other means will be readily recognized by those skilled in the art. Standoffs 32 provide a space between the columns of solderable metal layer 16 not having standoffs 32 fabricated on them, and thus prevent them from contacting a substrate surface (not shown) during solder removal. This further prevents solder residue from being left between solder pads and allows for a controllable, uniform amount of solder to be left on the substrate surface. In a preferred embodiment, standoff 32 is approximately 5 to 10 microns tall. Standoffs 32 must be evenly distributed on device 9 so that a distance between columns of solderable metal layer 16 and the substrate is obtained. Also, standoffs 32, along with columns of solderable metal layer 16 underneath them, may deform during operation, thus, a large cross-sectional area of standoffs 32 is desired. Standoffs 32 may be built in areas that will not contact solder bumps, such as around the perimeter of device 9 or near the center of device 9. If an area near the center of device 9 will not contact solder bumps, a single solderable metal layer 16 and standoff 32 may be formed to cover a large cross-sectional area, to increase the mechanical strength.

By now it should be appreciated that there has been provided an improved device for solder removal. This device provides for a uniform amount of solder to be left on solder pads, does not leave solder residue between solder pads, and is easy to fabricate, as well as inexpensive.

We claim:

1. A device for solder removal comprising:
   a supporting base comprised of a semiconductor material; and
   a plurality of columnar structures disposed on one side of the supporting base, the plurality of columnar structures being comprised of a solderable metal.

2. The device of claim 1 wherein the supporting base is comprised of silicon.

3. A device for solder removal comprising:
   a supporting base;
   a plurality of columnar structures disposed on one side of the supporting base, the plurality of columnar structures being comprised of a solderable metal, wherein standoffs are disposed on a portion of the plurality of columnar structures; and
   a barrier metal layer disposed on the plurality of columnar structures, on the standoffs and on the supporting base in between the plurality of columnar structures, and a non-oxidizing, solderable metal layer disposed on the barrier metal layer.

4. A device for solder removal comprising:
   a supporting base;
   a plurality of columnar structures disposed on one side of the supporting base, the plurality of columnar structures being comprised of a solderable metal, wherein standoffs are disposed on a portion of the plurality of columnar structures, and wherein the standoffs are comprised of a non-solderable metal.

5. The device of claim 4 wherein the standoffs are further comprised of a non-platable material and further comprising a barrier metal layer disposed on the plurality of columnar structures and on the supporting base in between the plurality of columnar structures, and a non-oxidizing, solderable metal layer disposed on the barrier metal layer.

6. The device of claim 1 further comprising an adhesion metal layer disposed on the supporting base, between the plurality of columnar structures and the supporting base.

7. The device of claim 6 further comprising a plating bus disposed on the adhesion metal layer, between the plurality of columnar structures and the adhesion metal layer.

8. The device of claim 1 wherein standoffs are disposed on a portion of the plurality of columnar structures, wherein the standoffs maintain the device for solder removal in a single plane.

9. The device of claim 8 further comprising a barrier metal layer disposed on the plurality of columnar structures, on the standoffs and on the supporting base in between the plurality of columnar structures, and a non-oxidizing, solderable metal layer disposed on the barrier metal layer.

10. The device of claim 8 wherein the standoffs are comprised of a non-solderable metal.

11. The device of claim 10 wherein the standoffs are further comprised of a non-platable material and further comprising a barrier metal layer disposed on the plurality of columnar structures and on the supporting base in between the plurality of columnar structures, and a non-oxidizing, solderable metal layer disposed on the barrier metal layer.

12. A device for solder removal, comprising:
   a supporting base comprised of silicon;
   a first metal layer comprised of titanium disposed on the supporting base;
   a plating bus comprised of copper disposed on the first metal layer;
   a plurality of columnar structures comprised of copper disposed on the first metal layer;
   a second metal layer comprised of nickel disposed on the plurality of columnar structures and on the plating bus in between the plurality of columnar structures; and
   a third metal layer comprised of gold disposed on the second metal layer.

13. A method of making a device for solder removal, comprising the steps of:
   providing a supporting base;
   forming an adhesion metal layer on the supporting base;
   forming a plurality of columnar structures comprised of a solderable metal on the adhesion metal layer.

14. The method of claim 13 wherein the plurality of columnar structures are formed by electroplating the solderable metal in openings of a masking layer disposed on the adhesion layer.

15. The method of claim 13 wherein the plurality of columnar structures are formed by forming the solderable metal on the adhesion metal layer and patterning and etching the solderable metal to provide the plurality of columnar structures.

16. The method of claim 13 further comprising the steps of:
   forming a plating bus on the adhesion metal layer before forming a plurality of columnar structures;

forming a barrier metal layer on the plurality of columnar structures and on the plating bus in between the plurality of columnar structures; and forming a non-oxidizing, solderable metal layer on the barrier metal layer.

17. The device of claim 1 wherein the plurality of columnar structures are comprised of copper.

18. A device for solder removal comprising:
a supporting base;
a plurality of columnar structures disposed on one side of the supporting base, the plurality of columnar structures being comprised of a solderable metal; and
a barrier metal layer disposed on the plurality of columnar structures and on the supporting base in between the plurality of columnar structures, and a non-oxidizing, solderable metal layer disposed on the barrier metal layer.

* * * * *